United States Patent
Nozawa et al.

(10) Patent No.: US 11,387,139 B2
(45) Date of Patent: Jul. 12, 2022

(54) METHOD OF MANUFACTURING SEMICONDUCTOR DEVICE

(71) Applicant: TOKYO ELECTRON LIMITED, Tokyo (JP)

(72) Inventors: Syuji Nozawa, Yamanashi (JP); Tatsuya Yamaguchi, Yamanashi (JP); Sunghil Lee, Gyeonggi-do (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 182 days.

(21) Appl. No.: 16/807,448

(22) Filed: Mar. 3, 2020

(65) Prior Publication Data
US 2020/0294844 A1  Sep. 17, 2020

(30) Foreign Application Priority Data
Mar. 11, 2019 (JP) .............................. JP2019-043841

(51) Int. Cl.
| | |
|---|---|
| *H01L 21/76* | (2006.01) |
| *H01L 21/764* | (2006.01) |
| *H01L 21/02* | (2006.01) |
| *H01L 21/3105* | (2006.01) |

(52) U.S. Cl.
CPC ........ *H01L 21/764* (2013.01); *H01L 21/0228* (2013.01); *H01L 21/02118* (2013.01); *H01L 21/02164* (2013.01); *H01L 21/31058* (2013.01)

(58) Field of Classification Search
CPC ............. H01L 21/764; H01L 21/02118; H01L 21/02164; H01L 21/0228; H01L 21/31058
See application file for complete search history.

(56) References Cited

U.S. PATENT DOCUMENTS

| | | | |
|---|---|---|---|
| 2018/0286744 A1* | 10/2018 | Yamaguchi | ....... H01L 21/02118 |
| 2019/0131125 A1* | 5/2019 | Yamaguchi | ....... H01L 21/76864 |
| 2020/0075417 A1* | 3/2020 | Lee | ................ H01L 21/823468 |
| 2021/0083046 A1* | 3/2021 | Lin | ................... H01L 21/76832 |

FOREIGN PATENT DOCUMENTS

JP        2012-54307 A       3/2012

* cited by examiner

*Primary Examiner* — Victor A Mandala
*Assistant Examiner* — Colleen E Snow
(74) *Attorney, Agent, or Firm* — Nath, Goldberg & Meyer; Jerald L. Meyer; Tanya E. Harkins

(57) ABSTRACT

A method of manufacturing a semiconductor device, the method including: a first film deposition process of stacking a polymer film on a substrate on which a recess is formed, wherein the polymer film is a film of a polymer having a urea bond and is formed by polymerizing a plurality of kinds of monomers; a second film deposition process of stacking a sealing film on the substrate in a state in which at least a bottom and a sidewall of the recess are covered with the polymer film; and a desorbing process of desorbing and diffusing the polymer film under the sealing film through the sealing film by depolymerizing the polymer film by heating the substrate to a first temperature.

7 Claims, 12 Drawing Sheets

METHOD OF MANUFACTURING SEMICONDUCTOR DEVICE

CROSS-REFERENCE TO RELATED APPLICATION(S)

This application is based upon and claims the benefit of priority from Japanese Patent Application No. 2019-043841, filed on Mar. 11, 2019, the entire contents of which are incorporated herein by reference.

TECHNICAL FIELD

Various aspects and embodiments of the present disclosure relate to a method of manufacturing a semiconductor device.

BACKGROUND

For example, Patent Document 1 discloses a technology that decreases a dielectric constant of an interlayer insulating film by using a space (air gap) formed due to poor embedding when the interlayer insulating film is embedded in a recess on a substrate. The top surface of the interlayer insulating film in which the air gap is formed is flattened by a Chemical-Mechanical Polishing (CMP) method. Further, a barrier film is stacked on the interlayer insulating film.

PRIOR ART DOCUMENT

Patent Document

Patent Document 1: Japanese Laid-Open Patent Publication No. 2012-54307

SUMMARY

According to one embodiment of the present disclosure, there is provided a method of manufacturing a semiconductor device, the method including: a first film deposition process, a second film deposition process and a desorbing process. In the first film deposition process, a polymer film is stacked on a substrate on which a recess is formed, wherein the polymer film is a film of a polymer having a urea bond and is formed by polymerizing a plurality of kinds of monomers. In the second film deposition process, a sealing film is stacked on the substrate in a state in which at least a bottom and a sidewall of the recess are covered with the polymer film. In the desorbing process, the polymer film under the sealing film is desorbed and diffused through the sealing film by depolymerizing the polymer film by heating the substrate to a first temperature.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

When unevenness of the top surface of an interlayer insulating film having an air gap is large, it is difficult to uniformly form another film on the interlayer insulating film in the next process. When the uniformity of the thickness of a film stacked on the interlayer insulating film is deteriorated, the characteristics that are obtained by the film may be changed. Accordingly, the top surface of the interlayer insulating film is flattened by polishing using a CMP method, etc.

The CMP method polishes substrates in which a semiconductor device is formed one by one. Accordingly, it takes time to manufacture semiconductor devices due to polishing.

Therefore, the present disclosure provides a technology that can reduce the number of processes of manufacturing a semiconductor device.

First Embodiment

[Configuration of Semiconductor Manufacturing Apparatus 1]

Figure 1:
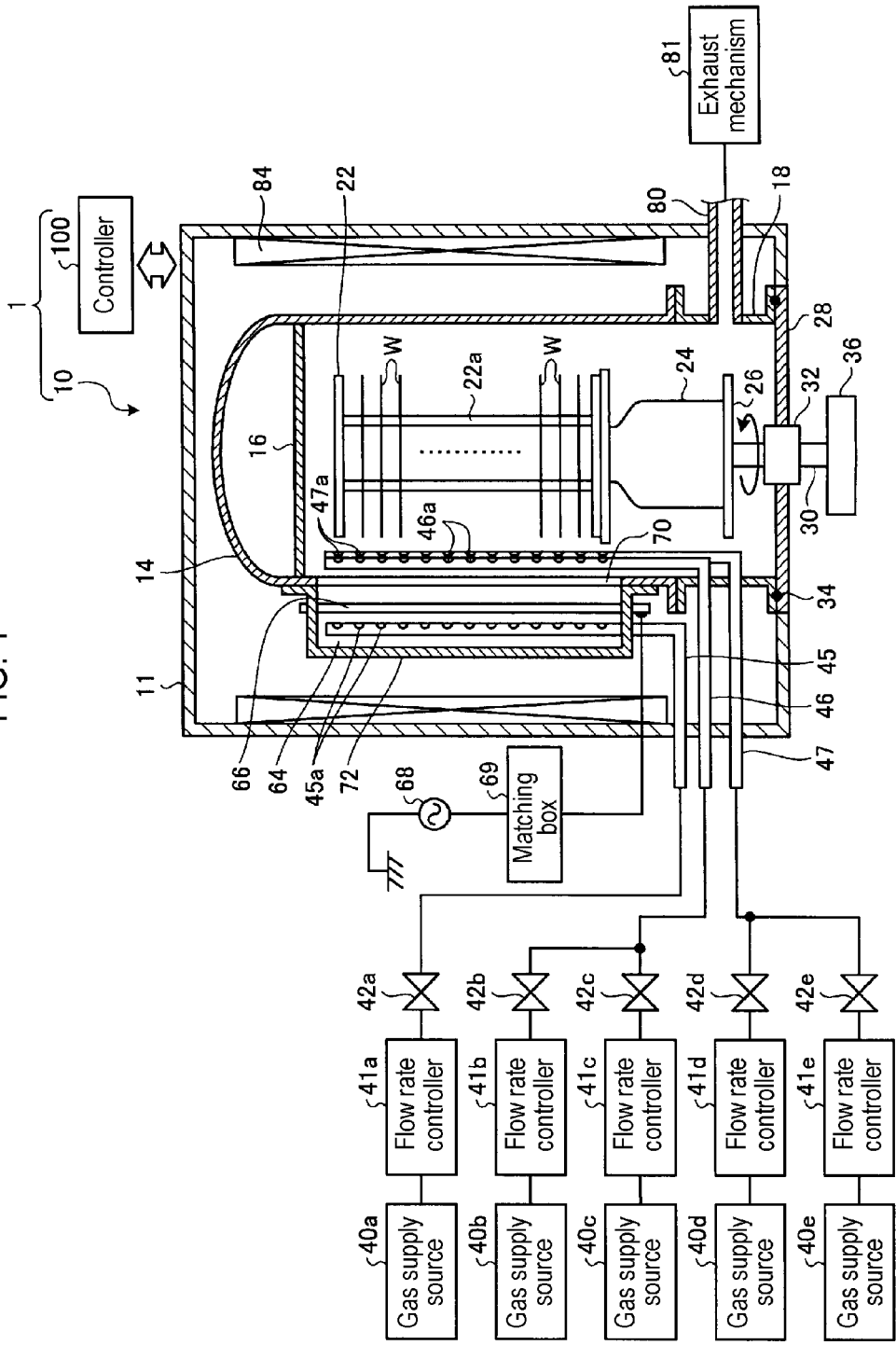
FIG. 1 is a vertical cross-sectional view showing an example of a semiconductor manufacturing apparatus according to an embodiment of the present disclosure.
Figure 2:
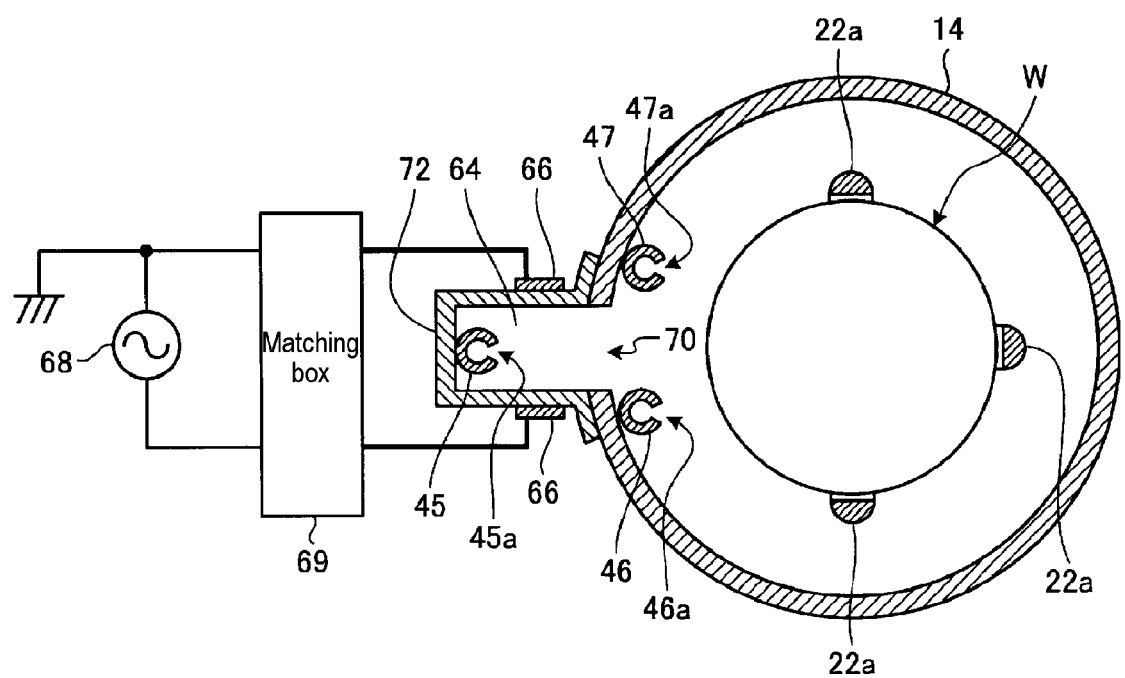
FIG. 2 is a horizontal cross-sectional view showing an example of a semiconductor manufacturing apparatus according to an embodiment of the present disclosure.

FIG. 1 is a vertical cross-sectional view showing an example of a semiconductor manufacturing apparatus 1 according to an embodiment of the present disclosure. FIG. 2 is a horizontal cross-sectional view showing an example of the semiconductor manufacturing apparatus 1 according to the embodiment of the present disclosure. The semiconductor manufacturing apparatus 1 includes an apparatus body 10 and a controller 100.

The apparatus body 10 includes a cover 11, for example, made of stainless steel and having a substantially cylindrical shape. A processing container 14 that is, for example, made of quartz and has an opening at the lower end thereof is disposed in the cover 11. The processing container 14 has a vertically long and substantially cylindrical shape. A ceiling plate 16, for example, made of quartz, is disposed at the ceiling of the processing container 14. Further, a manifold 18, for example, made of stainless steel, in a substantially cylindrical shape is connected to the opening at the lower end of the processing container 14 through a sealing member such as an O-ring. Further, the manifold 18 may also be made of quartz, and may be integrated with the processing container 14.

The lower end of the processing container 14 is supported by the manifold 18. A wafer boat 22 may be made of quartz, and is inserted into the processing container 14 from the bottom of the manifold 18. The wafer boat 22 has a plurality of supports 22a. Grooves are formed in the supports 22a at predetermined intervals in a vertical direction. Substrates W are supported and held by the grooves of the supports 22a, respectively, at predetermined intervals in a vertical direction. In this embodiment, the wafer boat 22, for example, supports and holds 100 sheets of the substrates W. Structures included in a semiconductor device are formed on each substrate W by the semiconductor manufacturing apparatus 1 of this embodiment.

The wafer boat 22 is disposed on a table 26 with a heat insulating mold 24, for example, made of quartz. The table 26 is supported by a rotary shaft 30 passing through a cover member 28 that opens/covers the opening at the lower end of the manifold 18. The cover member 28 is, for example, made of stainless steel. The lower end of the rotary shaft 30 is connected to a rotational mechanism 36 and the rotational mechanism 36 rotates the rotary shaft 30. When the rotary shaft 30 rotates, a plurality of substrates W supported and held by the wafer boat 22 rotates about the rotary shaft 30. A magnetic fluid seal 32 may be disposed in an opening of the cover member 28 that the rotary shaft 30 passes through. The rotary shaft 30 can rotate while the processing container 14 is hermetically sealed by the magnetic fluid seal 32. The cover member 28 and the manifold 18 are connected to each other with the sealing member 34 such as an O-ring interposed therebetween.

The wafer boat 22, the heat insulating mold 24, the table 26, the cover member 28, the rotary shaft 30, the magnetic fluid seal 32, and the rotational mechanism 36 are integrally inserted into the processing container 14 by an elevator such as a boat elevator (not shown). The table 26 may be fixed to the cover member 28 such that the substrates W can be processed without rotating the wafer boat 22.

A pipe 46 and a pipe 47 for supplying gas into the processing container 14 are connected to the manifold 18. The pipe 46 and the pipe 47, for example, are made of quartz, penetrate through a sidewall of the manifold 18, and vertically extend in the processing container 14 along a sidewall of the processing container 14. In a sidewall of the pipe 46 positioned in the processing container 14, a plurality of gas discharge holes 46a is formed at predetermined intervals in a vertical direction. Gas supplied through the pipe 46 is supplied into the processing container 14 through the gas discharge holes 46a. In a sidewall of the pipe 47 positioned in the processing container 14, a plurality of gas discharge holes 47a is also formed at predetermined intervals in a vertical direction. Gas supplied through the pipe 47 is supplied into the processing container 14 through the gas discharge holes 47a.

One end of each of a valve 42b and a valve 42c is connected to the pipe 46. A gas supply source 40b is connected to the other end of the valve 42b through a flow rate controller 41b such as a Mass Flow Controller (MFC). The gas supply source 40b is a supply source for a first monomer gas. In this embodiment, the first monomer is, for example, amine. The gas supplied from the gas supply source 40b is supplied to the pipe 46 while a flow rate of the gas is adjusted by the flow rate controller 41b, and then supplied into the processing container 14 through the gas discharge holes 46a.

Further, a gas supply source 40c is connected to the other end of the valve 42c through a flow rate controller 41c such as an MFC. The gas supply source 40c is a supply source for a second monomer gas. In this embodiment, the second monomer is, for example, isocyanate. The gas supplied from the gas supply source 40c is supplied to the pipe 46 while a flow rate of the gas is adjusted by the flow rate controller 41c, and then supplied into the processing container 14 through the gas discharge holes 46a.

Further, in this embodiment, the first monomer gas and the second monomer gas are supplied into the processing container 14 through one pipe 46, but the present disclosure is not limited thereto. The first monomer gas and the second monomer gas may be supplied into the processing container 14 respectively through separate pipes 46.

One end of each of a valve 42d and a valve 42e is connected to the pipe 47. Further, a gas supply source 40d is connected to the other end of the valve 42d through a flow rate controller 41d such as an MFC. The gas supply source 40d is a supply source for a precursor gas. In this embodiment, the precursor gas is, for example, diisopropylamino silane gas. The precursor gas supplied from the gas supply source 40d is supplied to the pipe 47 while a flow rate of the precursor gas is adjusted by the flow rate controller 41d, and then supplied into the processing container 14 through the gas discharge holes 47a.

Further, a gas supply source 40e is connected to the other end of the valve 42e through a flow rate controller 41e such as an MFC. The gas supply source 40e is a supply source for a purge gas. In this embodiment, the purge gas is, for example, nitrogen gas. The purge gas supplied from the gas supply source 40e is supplied to the pipe 47 while a flow rate of the purge gas is adjusted by the flow rate controller 41e, and then supplied into the processing container 14 through the gas discharge holes 47a.

An exhaust mechanism 81 is connected to the manifold 18 through an exhaust pipe 80. The gas in the processing container 14 is discharged through the exhaust pipe 80 by the exhaust mechanism 81.

Further, an opening 70 is formed in the sidewall of the processing container 14 along longitudinal direction of the processing container 14 and a plasma generation box 64 defined by a plasma partition wall 72 is connected to the opening 70. A pipe 45, for example, made of quartz, is vertically elongated along the plasma partition wall 72 in the plasma generation box 64, for example, as shown in FIG. 2. In a sidewall of the pipe 45 positioned in the plasma generation box 64, a plurality of gas discharge holes 45*a* is formed at predetermined intervals in a vertical direction. Gas supplied through the pipe 45 is supplied into the plasma generation box 64 through the gas discharge holes 45*a*.

One end of a valve 42*a* is connected to the pipe 45. A gas supply source 40*a* is connected to the other end of the valve 42*a* through a flow rate controller 41*a* such as an MFC. The gas supply source 40*a* is a supply source for a reaction gas. In this embodiment, the reaction gas, for example, is oxygen gas. The reaction gas supplied from the gas supply source 40*a* is supplied to the pipe 45 while a flow rate of the reaction gas is adjusted by the flow rate controller 41*a*, and then supplied into the plasma generation box 64 through the gas discharge holes 45*a*.

Figure 3:
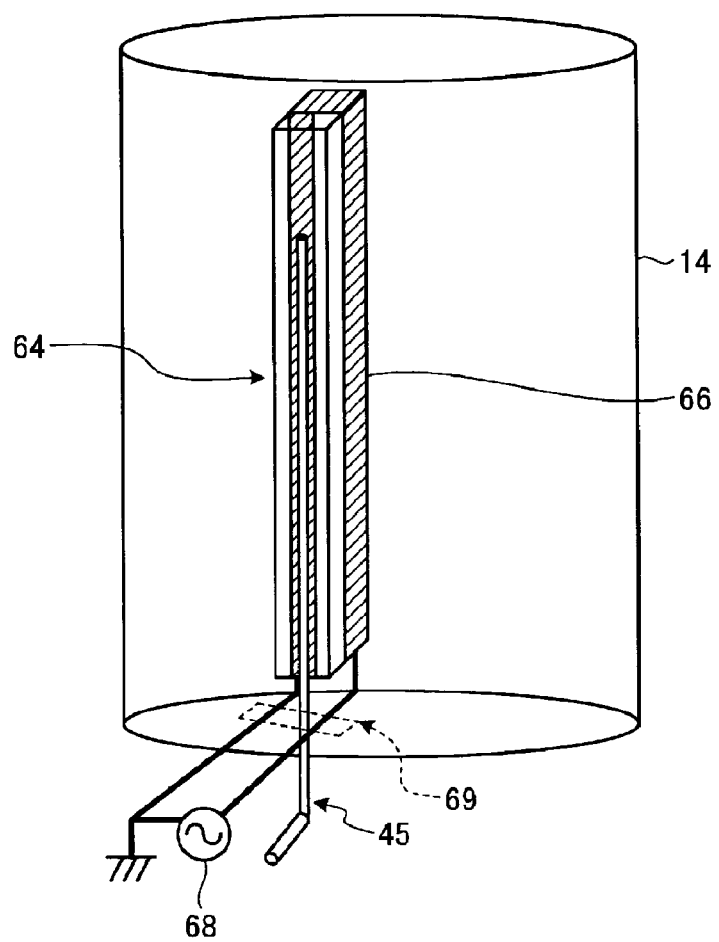
FIG. 3 is a schematic view showing an example of the positional relationship between a processing container and a plasma generation box.

Further, electrodes 66 are vertically disposed along opposite sidewalls of the plasma partition wall 72. The electrodes 66 disposed along the opposite sidewalls of the plasma partition wall 72 are connected at an upper end of the plasma partition wall 72. That is, the electrodes 66, for example, are folded at the upper end of the plasma partition wall 72, as shown in FIG. 3, thereby functioning as a substantially one-turn coil. FIG. 3 is a schematic view showing an example of the positional relationship between the processing container 14 and the plasma generation box 64.

A high-frequency power source 68 is electrically connected to the electrodes 66 through a matching box 69. The high-frequency power source 68 supplies high-frequency power for generating plasma to the electrodes 66 through the matching box 69. In this embodiment, the high-frequency power source 68 supplies high-frequency power at a frequency within a range of 4 MHz to 27 MHz, for example, at frequency of 13.56 MHz to the electrodes 66 through the matching box 69. The electrodes 66 generate an induced magnetic field in the plasma generation box 64 using the high-frequency power supplied from the high-frequency power source 68 through the matching box 69.

The reaction gas supplied into the plasma generation box 64 is excited by the induced magnetic field generated in the plasma generation box 64, thereby changing into plasma. Further, ions or active species included in the plasma are supplied into the processing container 14 through the opening 70.

Further, the electrodes 66 are covered with insulating protective covers (not shown) and refrigerant passages (not shown) are formed in the insulating protective covers. A refrigerant such as nitrogen gas flows through the refrigerant passages, thereby suppressing an increase in temperature of the electrodes 66.

Further, a heater 84 for heating the plurality of substrates W supported and held in the wafer boat 22 is disposed on an inner sidewall of the cover 11 around the processing container 14.

The controller 100 includes a memory, a processor, and an Input/output interface. Programs that are executed by the processor and recipes including such as conditions for respective processing are stored in the memory. The processor executes programs read out from the memory such that respective parts of the apparatus body 10 are controlled through the Input/output interface on the basis of the recipes stored in the memory, thereby performing predetermined processing such as plasma processing.

[Method of Manufacturing Semiconductor Device]

Figure 4:
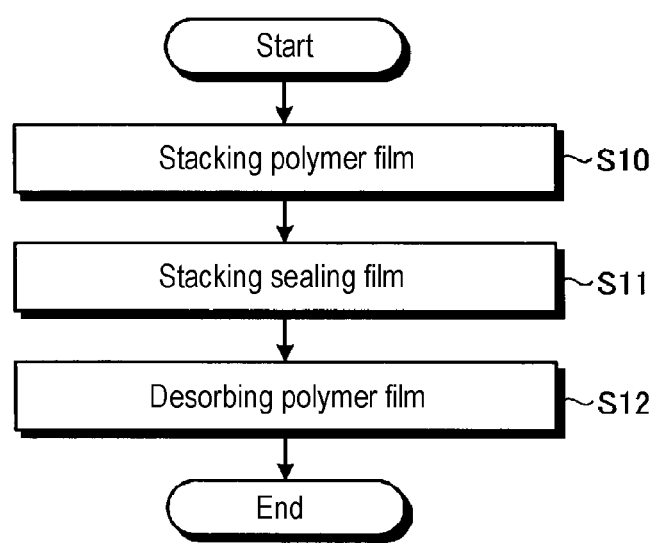
FIG. 4 is a flowchart showing a method of manufacturing a semiconductor device in a first embodiment of the present disclosure.

FIG. 4 is a flowchart showing a method of manufacturing a semiconductor device in a first embodiment of the present disclosure. The method of manufacturing a semiconductor device shown in FIG. 4 is performed usually by the controller 100 controlling the respective parts of the apparatus body 10.

Figure 5:
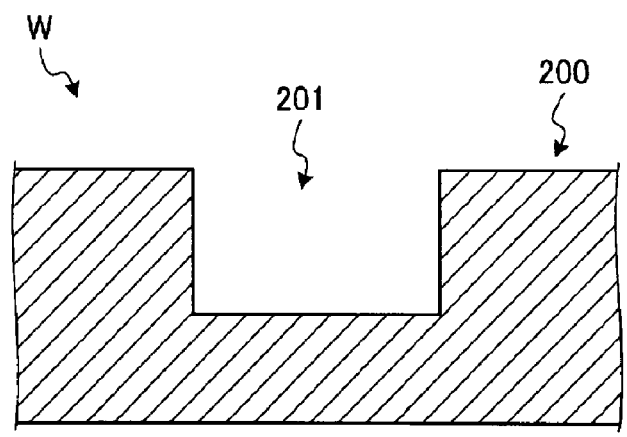
FIG. 5 is a view showing an example of a cross-section of a substrate.

In the method of manufacturing a semiconductor device shown in FIG. 4, for example, the substrate W shown in FIG. 5 is prepared. FIG. 5 is a view showing an example of a cross-section of the substrate W. The prepared substrate W has a base member 200 having a recess 201. The recess 201 is a groove or a hole having a bottom. The base member 200 is, for example, made of silicon. For example, a plurality of substrates W shown in FIG. 5 is supported and held by the wafer boat 22 and loaded into the processing container 14.

Further, a polymer film is stacked on the substrates W (S10). Step S10 is an example of a first film deposition process. In step S10, the substrates W are heated by the heater 84 such that the temperature of the substrates W reaches a temperature suitable for vapor deposition polymerization of the first polymer and the second polymer. An appropriate temperature for vapor deposition polymerization may depend on the kinds of polymers, and for example, is 40 to 150 degrees C. In this embodiment, the appropriate temperature for vapor deposition polymerization is, for example, 80 degrees C.

Figure 6:
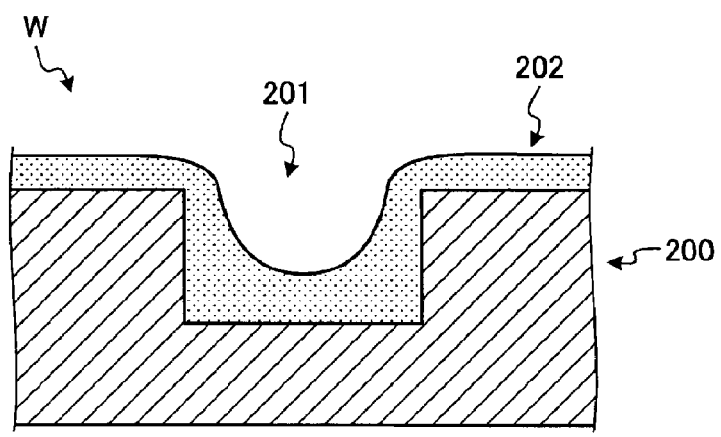
FIG. 6 is a view showing an example of a cross-section of the substrate after a polymer film is stacked.

After the temperature of the substrates W is stabilized at the appropriate temperature for vapor deposition polymerization, the controller 100 causes the valve 42*b* and the valve 42*c* to open. Further, a first monomer gas controlled at a predetermined flow rate by the flow rate controller 41*b* and the second monomer gas controlled at a predetermined flow rate by the flow rate controller 41*c* are supplied into the processing container 14 from the gas discharge holes 46*a* through the pipe 46. The first monomer and the second monomer supplied in the processing container 14 are vapor-deposited and polymerized on the surfaces of the substrates W. For example, as shown in FIG. 6, polymer films 202 are stacked on the surfaces of the substrates W. FIG. 6 is a view showing an example of a cross-section of the substrate W after the polymer film 202 is stacked. When two kinds of the monomers are amine and isocyanate, a polymer film 202 that is a polymer having a urea bond is stacked on the surface of the substrate W.

The polymer film 202 is stacked on a bottom and a sidewall of the recess 201 and a top surface of the substrate W except for the recess 201. In this embodiment, at least the bottom and the sidewall of the recess 201 are covered with the polymer film 202. After the polymer film 202 having a predetermined thickness is stacked on the substrate W, the controller 100 closes the valve 42*b* and the valve 42*c*. The thickness of the polymer film 202 is, for example, 60 nm or more. Further, the polymer film 202 may have a thickness less than 60 nm as long as it can cover at least the entire bottom and entire sidewall of the recess 201.

Next, a sealing film is stacked on the substrate W in a state in which at least the bottom and the sidewall of the recess 201 are covered with the polymer film 202 (S11). Step S11 is an example of a second film deposition process. In this embodiment, the sealing film is a Low-Temperature Oxide (LTO) film. The LTO film is, for example, a silicon oxide film formed at a low temperature and is a film that is a sparse film in comparison to a thermally oxidized film formed at a high temperature. In step S11, the substrates W are heated to a predetermined temperature by the heater 84. The predetermined temperature, for example, is a temperature within the range between room temperature and 250 degrees C. The room temperature is, for example, a temperature within the range of 25 degrees C. or more and 30 degrees C. or less. In this embodiment, the predetermined temperature is, for example, 200 degrees C.

After the temperature of the substrates W is stabilized at the predetermined temperature, the controller 100 performs the film deposition to stack a sealing film on the surfaces of the substrates W with the polymer film 202 formed thereon, using Atomic Layer Deposition (ALD). In ALD, an adsorption process, a first purging process, a reaction process, and a second purging process are repeated in this order a predetermined number of times.

In the adsorption process, the valve 42d is controlled to open and a precursor gas controlled at a predetermined flow rate by the flow rate controller 41d is supplied into the processing container 14 from the gas discharge holes 47a through the pipe 47. Accordingly, the molecules of the precursor gas supplied in the processing container 14 are adsorbed to the surfaces of the substrates W. Thereafter, the valve 42d is controlled to close.

In the first purging process, the valve 42e is controlled to open and a purge gas controlled at a predetermined flow rate by the flow rate controller 41e is supplied into the processing container 14 from the gas discharge holes 47a through the pipe 47. Accordingly, the molecules of the precursor gas excessively adsorbed to the surfaces of the substrates W are removed. Thereafter, the valve 42e is closed. Similar to the first purging process, in the second purging process, a purge gas controlled at a predetermined flow rate by the flow rate controller 41e is supplied into the processing container 14.

In the reaction process, the valve 42a is controlled to open and a reaction gas controlled at a predetermined flow rate by the flow rate controller 41a is supplied into the plasma generation box 64 from the gas discharge holes 45a through the pipe 45. Further, high-frequency power is supplied to the electrodes 66 from the high-frequency power source 68 through the matching box 69, whereby an induced magnetic field is generated in the plasma generation box 64. Accordingly, the reaction gas supplied into the plasma generation box 64 changes into plasma, and the ions or active species included in the plasma and the molecules of the precursor gas adsorbed to the surfaces of the substrates W react with each other, whereby a first-atomic layer sealing film is stacked on the surfaces of the substrate W. Thereafter, the valve 42a is controlled to close, and the supply of the high-frequency power to the electrodes 66 from the high-frequency power source 68 is stopped.

Figure 7:
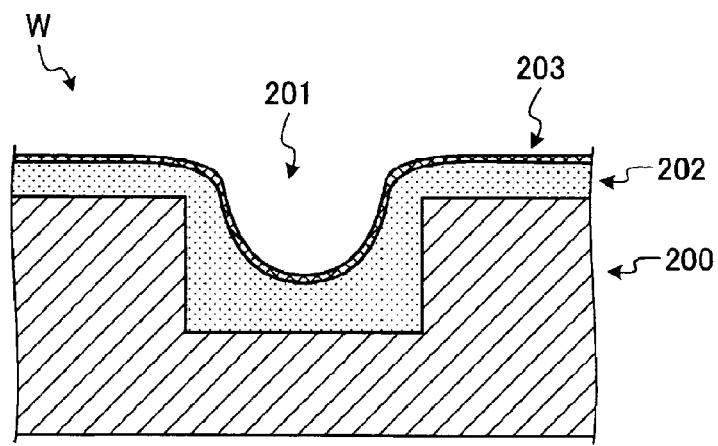
FIG. 7 is a view showing an example of a cross-section of the substrate after a sealing film is stacked.

Accordingly, for example, a sealing film 203 is formed on the polymer film 202, as shown in FIG. 7. FIG. 7 is a view showing an example of a cross-section of the substrate W after the sealing film 203 is stacked. In this embodiment, the sealing film 203 having a thickness of, for example, 2 nm or more is formed on the polymer film 202.

Next, the polymer films stacked on the substrates W are desorbed (S12). Thereafter, the method of manufacturing a semiconductor device shown in the flowchart is finished. Step S12 is an example of a separation process. In step S12, the substrates W are heated to a first temperature. The first temperature is a temperature suitable for the polymer layer 202 to be depolymerized into the first polymer and the second polymer. The temperature suitable for depolymerization may depend on the kinds of monomers. When the first monomer and the second monomer are amine and isocyanate, the first temperature is, for example, 250 degrees C. or more. In this embodiment, the first temperature is, for example, 400 degrees C.

Figure 8:
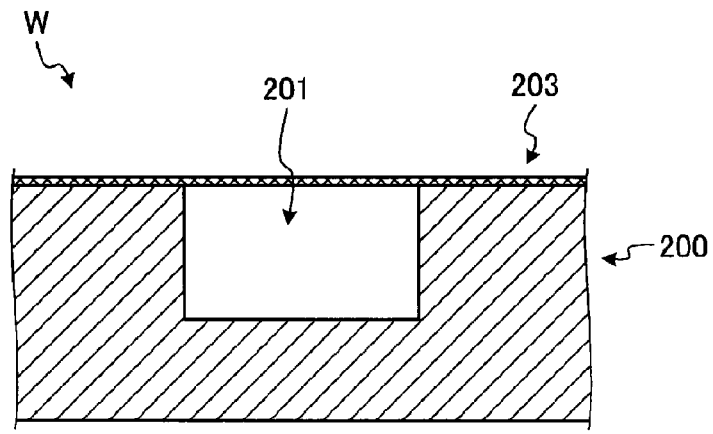
FIG. 8 is a view showing an example of a cross-section of the substrate after a polymer film is removed.

Accordingly, the polymer film 202 under the sealing film 203 is depolymerized into a first monomer and a second monomer, and changed into gas, thereby being desorbed and diffused into the processing container 14 through the sealing film 203. When the first monomer and the second monomer are depolymerized, the pressure of the gas between the sealing film 203 and the base member 200 is increased by the gas of the depolymerized first and second monomers. Further, the gas of depolymerized first monomer and second monomer lifts the sealing film 203 when being desorbed and diffused into the processing container 14 through the sealing film 203. Accordingly, the sealing film 203 which has been recessed along the shape of the polymer film 202 stacked in the recess is lifted up. Accordingly, for example, the sealing film 203 is flattened, as shown in FIG. 8. FIG. 8 is a view showing an example of a cross-section of the substrate W after the polymer film 202 is removed. Further, in a top surface of the substrate W except for the recess 201, the sealing film 203 moves down and contacts to the base member 200 due to gasification and desorption of the polymer film 202.

In this case, an air gap may be formed as a poor embedding of an insulating film by intentionally generating poor embedding when the insulating film is embedded in the recess of a substrate. However, in this case, the insulating film embedded in the recess is stacked even on the substrate W other than the recess. Further, the height of the insulating film stacked on the substrate W may be different between the recess and a vicinity of the recess. When unevenness of the top of a substrate is large and another film is stacked on an air gap, it is difficult to stack the film with a uniform thickness. Accordingly, the top surface of the substrate is flattened through polishing by CMP method or the like. However, polishing takes a long time, so it takes time to manufacture a semiconductor device.

Figure 9:
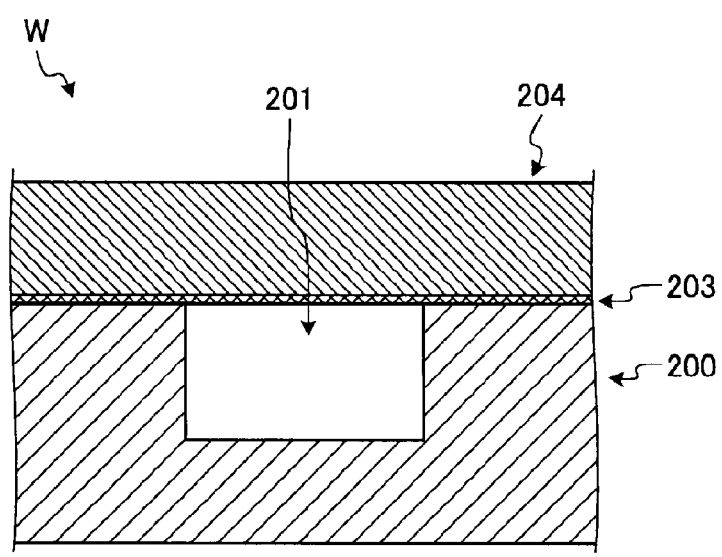
FIG. 9 is a view showing an example of a cross-section of a substrate after another film is stacked on a sealing film.

In contrast, in the semiconductor manufacturing apparatus 1 of the embodiment, the sealing film 203 is flattened when the polymer film 202 under the sealing film 203 is desorbed. Accordingly, it is not required to polish the substrate W after an air gap is formed under the sealing film 203. Therefore, for example, as shown in FIG. 9, it is possible to stack another film 204 such as a protective film on the sealing film 203 without polishing the substrate W after an air gap is formed under the sealing film 203. Therefore, it is possible to omit one process that is a polishing process of the manufacturing processes of a semiconductor device. Therefore, it is possible to reduce the time needed to manufacture a semiconductor device.

[Test Result]

Figure 10:
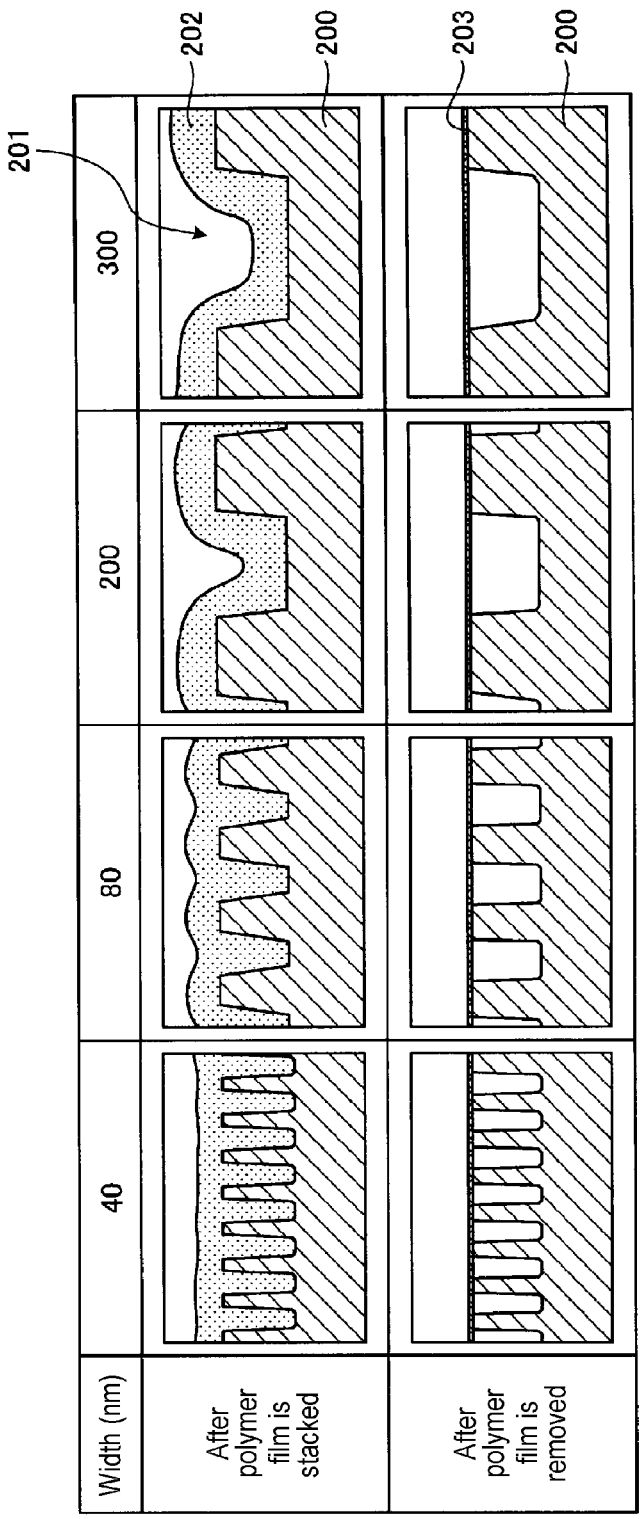
FIG. 10 is a cross-sectional view of substrates showing an example of a test result in the first embodiment of the present disclosure.

FIG. 10 is a cross-sectional view of substrates W showing an example of a test result in the first embodiment of the present disclosure. In the test, a polymer film 202 having a thickness of 120 nm was formed on substrates W having grooves with different widths, a sealing film 203 having a thickness of 2 nm was stacked on the polymer film 202, and then the polymer film 202 under the sealing film 203 was removed. The depths of the grooves formed on the substrates W were 200 nm.

As shown in FIG. 10, regardless of the widths of the grooves, the shape of the sealing film 203 after the polymer film 202 was removed was flattened. Accordingly, it was not required to polish the sealing film 203 when stacking another film such as a protective film on the sealing film 203. Therefore, it is possible to reduce the time needed to manufacture a semiconductor device.

The first embodiment was described above. As described above, the method of manufacturing a semiconductor device of this embodiment includes a first film deposition process, a second film deposition process, and a desorbing process. In the first film deposition process, a polymer film 202 that is a film of a polymer having a urea bond and formed by polymerization of a plurality of kinds of monomers is stacked on a substrate W having recesses 201. In the second film deposition process, a sealing film 203 is stacked on the substrate W in a state in which at least the bottom and the sidewall of the recess 201 are covered with the polymer film 202. In the desorbing process, the substrate W is heated to a first temperature to depolymerize the polymer film 202, and the polymer film 202 under the sealing film 203 is desorbed and diffused through the sealing film 203. Accordingly, it is possible to decrease the manufacturing process of a semiconductor device.

In the embodiment described above, in the second film deposition process, a sealing film 203 is stacked by ALD on the substrate W on which the polymer film 202 is staked. Accordingly, the sealing film 203 can be stacked in a conformal type along the shape of the top surface of the polymer film 202.

In the embodiment described above, the sealing film 203 is a silicon oxide film. Accordingly, in the desorbing process, the gas of a plurality of kinds of monomers desorbed under the sealing film 203 can be desorbed and diffused through the sealing film 203.

Second Embodiment

In the first embodiment, the polymer film 202 is stacked and then the sealing film 203 is stacked. However, this embodiment is different from the first embodiment in that, after the polymer film 202 is stacked, the polymer film 202 on the top surface of the substrate W except for the recess 201 is removed, and then the sealing film 203 is stacked, which. The configuration of the semiconductor manufacturing apparatus 1 is the same as the semiconductor manufacturing apparatus 1 described in the first embodiment, and descriptions thereof is omitted.

[Method of Manufacturing Semiconductor Device]

Figure 11:
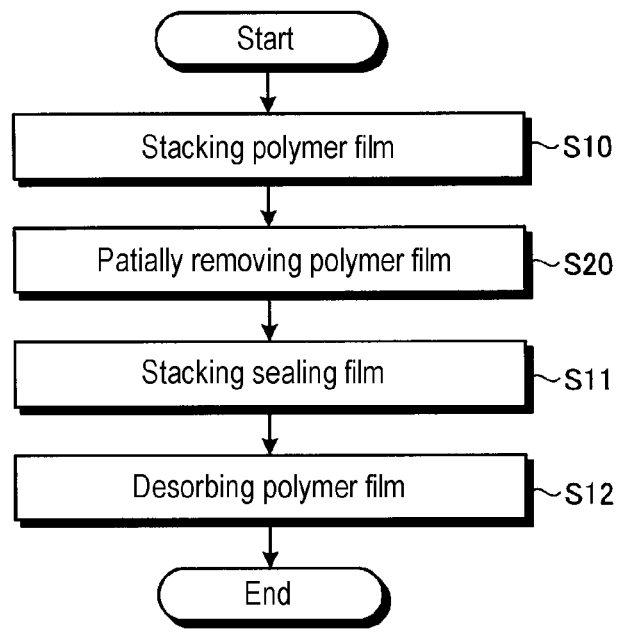
FIG. 11 is a flowchart showing a method of manufacturing a semiconductor device in a second embodiment of the present disclosure.

FIG. 11 is a flowchart showing a method of manufacturing a semiconductor device in a second embodiment of the present disclosure. The method of manufacturing a semiconductor device shown in FIG. 11 is performed usually by the controller 100 controlling the respective parts of the apparatus body 10. The processing shown in FIG. 11 and given the same reference numbers as those in FIG. 4 is the same as the processing described with reference to FIG. 4 except for the following description, and descriptions thereof is omitted.

In step S10, after the polymer film 202 is formed on the substrate W, the polymer film 202 on the substrate W is partially removed (S20). Step S20 is an example of a removing process. In step S20, the substrates W are heated to a second temperature. The second temperature is a temperature at which the polymer layer 202 is depolymerized into the first polymer and the second polymer, and is lower than the first temperature. The first temperature may depend on the kinds of monomers. In this embodiment, the second temperature is, for example, 290 degrees C.

Figure 12:
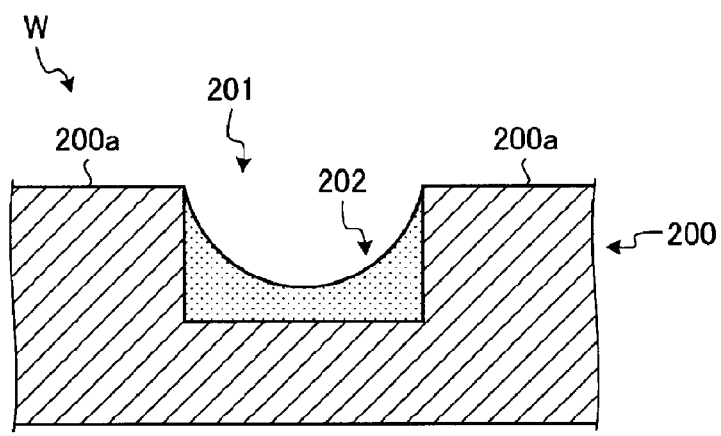
FIG. 12 is a view showing an example of a cross-section of the substrate after a portion of a polymer film is removed.

Accordingly, the polymer film 202 stacked on the substrate W is sequentially depolymerized from its upper portion into a first monomer and a second monomer and changed into gas, thereby being desorbed and diffused into the processing container 14. In this embodiment, step S20 is continued until the polymer film 202 stacked on the surface of the substrate W except for the recess 201 is removed. Accordingly, the cross-section of the substrate W is, for example, formed as in FIG. 12. FIG. 12 is a view showing an example of a cross-section of the substrate W after a portion of the polymer film 202 is removed. After step S20 is performed, the polymer film 202 has been removed from the surface 200a of the substrate W except for the recess 201, for example, as shown in FIG. 12. However, the bottom and the sidewall of the recess 201 are still covered with the polymer film 202.

Figure 13:
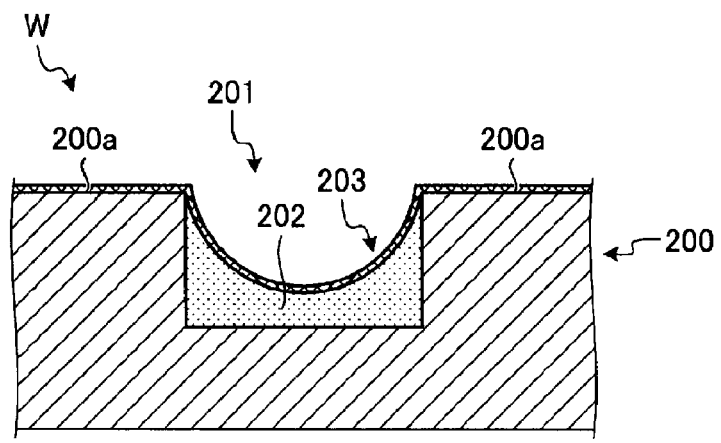
FIG. 13 is a view showing an example of a cross-section of the substrate after a sealing film is stacked.

Next, a sealing film is stacked onto the substrates W (S11). Accordingly, the cross-section of the substrate W is, for example, formed as in FIG. 13. FIG. 13 is a view showing an example of a cross-section of the substrate W after the sealing film 203 is stacked. Since the polymer film 202 is removed from the surface 200a of the substrate W except for the recess 201 through step S20, Step S11 is executed, and the sealing film 203 is formed on the surface 200a of the substrate W while the polymer film 202 is not interposed between the surface 200a and the sealing film 203. Accordingly, the adhesion between the surface 200a of the base member 200 and the sealing film 203 is improved. Accordingly, it is possible to prevent the sealing film 203 being separated from the base member 200 when a physical force such as polishing is applied to a film stacked on the sealing film 203. Thereafter, step S12 is executed, the polymer film 202 in the recess 201 under the sealing film 203 is desorbed, and the cross-section of the substrate W becomes, for example, the cross-section of the substrate shown in FIG. 8.

[Test Result]

Figure 14:
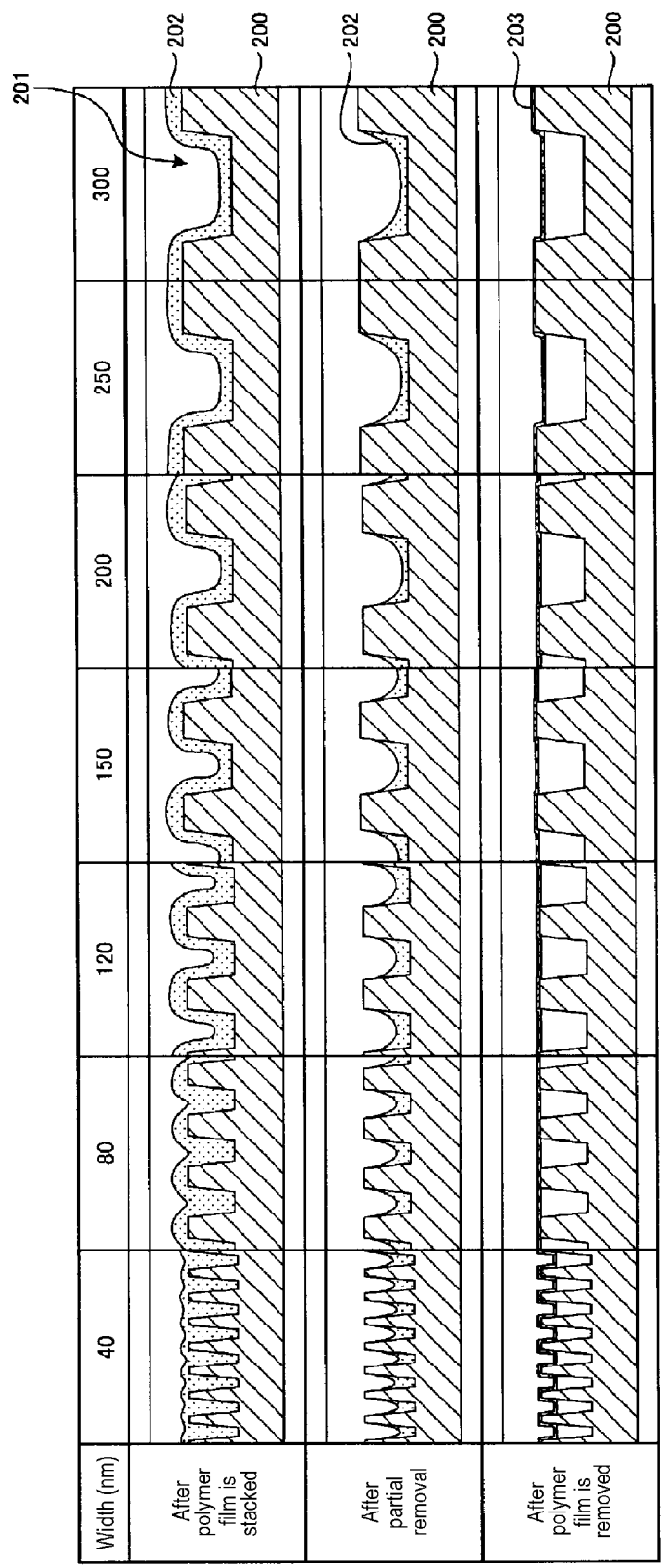
FIG. 14 is a cross-sectional view showing an example of a test result in the second embodiment of the present disclosure.
Figure 15:
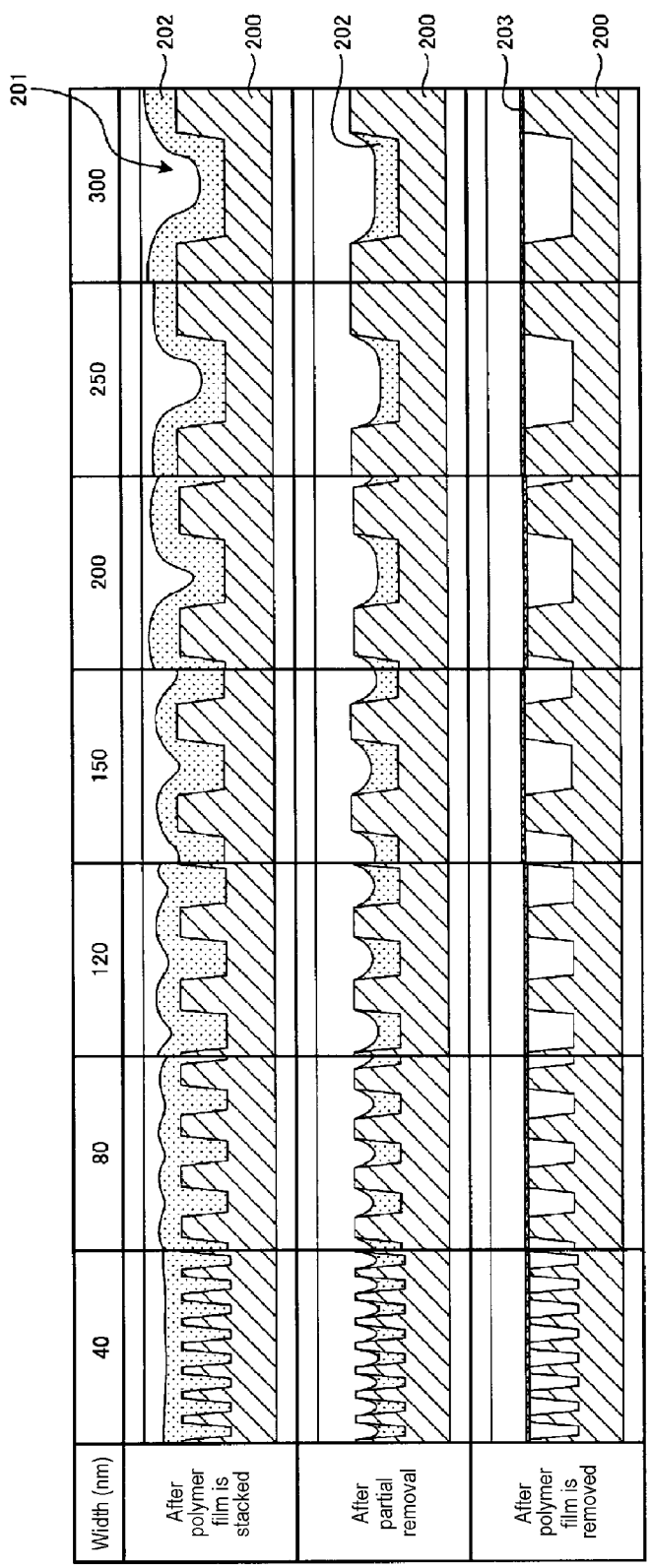
FIG. 15 is a cross-sectional view showing an example of a test result in the second embodiment of the present disclosure.

FIGS. 14 and 15 are cross-sectional views of substrates W showing an example of a test result in the second embodiment of the present disclosure. In the test results shown in FIGS. 14 and 15, a polymer film 202 having a predetermined thickness was stacked on substrates W having grooves with different widths, and the substrates W were heated at the second temperature for 10 minutes. Further, a sealing film 203 having a thickness of 2 nm was stacked, and then the polymer film 202 under the sealing film 203 was removed. A polymer film 202 having a thickness of 60 nm was stacked in FIG. 14, and a polymer film 202 having a thickness of 120 nm was stacked in FIG. 15. In FIGS. 14 and 15, the depths of the grooves formed on the substrates W were all 200 nm.

In the test result shown in FIG. 14, since the heating time at the second temperature was long relative to the thickness of the stacked polymer film 202, the polymer film 202 was desorbed at an upper portion of sidewalls of the recesses 201. Accordingly, when the sealing film 203 was stacked, the sealing film 203 and the upper portion of the sidewalls of the recesses 201 were brought in close contact with each other, so it is considered that even though the polymer film 202 under the sealing film 203 was desorbed, the sealing film 203 was flattened on the upper portion of the sidewalls of the recesses 201. In the test result shown in FIG. 14, the heights of the sealing films 203 were different in the recesses 201 and in the surfaces of the substrates W except for the recesses 201 in some cases. However, the sealing films 203 after the polymer films 202 were desorbed were flattened regardless of the widths.

In contrast, in the test result shown in FIG. 15, since the entire bottom and the entire sidewalls of the recess 201 were covered with the polymer film 202 even after heating at the second temperature, the sealing film 203 in the recess 201 had the same height as that of the sealing film 203 on the surface of the substrate W except for the recess 201. Accordingly, the entire sealing film 203 was flattened.

According to the test results shown in FIGS. 14 and 15, it is preferable that the heating time at the second temperature is the time or more required until the polymer films 202 on the surfaces of the substrates W are all desorbed, and less than the time required until the upper portion of the sidewalls of the recesses 201 are exposed. Accordingly, it is possible to form an entirely flat sealing film 203 on the substrates W having the recess 201.

The second embodiment was described above. As described above, the method of manufacturing a semiconductor device in this embodiment includes a removing process that removes a polymer film 202 stacked on a substrate W except for a recess 201 by heating the substrate W to a second temperature lower than a first temperature after the first film deposition process. Further, the second film deposition process is performed after the removing process. Accordingly, it is possible to improve the adhesion between the sealing film 203 and the surface 200a of the base member 200.

[Others]

Further, the technology disclosed herein is not limited to the above embodiment and may be changed in various ways within the spirit thereof.

For example, although the sealing films 203 were stacked by ALD in the embodiments described above, the present disclosure is not limited thereto. A sealing film 203 may be stacked by plasma Chemical Vapor Deposition (CVD). When a sealing film 203 is stacked by plasma CVD, for example, the heater 84 heats substrates W such that the temperature of the substrates W becomes 100 degrees C. Further, each processing gas controlled at a predetermined flow rate is supplied into the plasma generation box 64 from the gas discharge holes 45a of the pipe 45. The processing gas is, for example, a gas mixture of oxygen gas and TMS (trimetylsilane) gas.

Further, high-frequency power is supplied to the electrodes 66 through the matching box 69 from the high-frequency power source 68, whereby an induced magnetic field is generated in the plasma generation box 64. Accordingly, the processing gas supplied in the plasma generation box 64 changes into plasma, and a sealing film 203 that is a silicon oxide film is stacked on the surface of the substrate W by ions or active species included in the plasma.

Although a polymer having a urea bond was used as an example of the polymer composing the polymer films 202 in the embodiments described above, polymers having a bond other than a urea bond may be used as a polymer composing the polymer films 202. For example, polyurethane having a urethane bond may be a polymer having a bond other than a urea bond. Polyurethane, for example, may be synthesized by polymerizing a monomer having an alcohol group and a monomer having an isocyanate group. Polyurethane is desorbed into a monomer having an alcohol group and a monomer having an isocyanate group by being heated to a predetermined temperature.

Although a low-temperature oxide film such as a silicon oxide film formed at a low temperature was exemplified as the sealing film 203 that seals the polymer film 202 in the embodiments described above, a low-temperature nitride film such as a silicon nitride film may be used as the sealing film 203 other than the low-temperature oxide film such as a silicon oxide film. The low-temperature nitride film is a film that is, for example, formed by plasma CVD at a low temperature (e.g., about 200 degrees C.) and is more sparse than a silicon nitride film formed at a high temperature (hundreds of degrees C.).

According to various aspects and embodiments of the present disclosure, it is possible to decrease the manufacturing process of a semiconductor device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, the method comprising:
   a first film deposition process of stacking a polymer film on a substrate on which a recess is formed, wherein the polymer film is a film of a polymer having a urea bond and is formed by polymerizing a plurality of kinds of monomers;
   a second film deposition process of stacking a sealing film on the substrate in a state in which at least a bottom and a sidewall of the recess are covered with the polymer film; and
   a desorbing process of desorbing and diffusing the polymer film under the sealing film through the sealing film by depolymerizing the polymer film by heating the substrate to a first temperature.

2. The method of claim 1, further comprising a removing process of removing the polymer film stacked on a surface of the substrate except for the recess by heating the substrate to a second temperature lower than the first temperature after the first film deposition process.

3. The method of claim 2, wherein the sealing film is stacked on the substrate, on which the polymer film is stacked, by an Atomic Layer Deposition (ALD) during the second film deposition process.

4. The method of claim 3, wherein the sealing film is a silicon oxide film.

5. The method of claim 1, wherein the sealing film is stacked on the substrate, on which the polymer film is stacked, by an Atomic Layer Deposition (ALD) during the second film deposition process.

6. The method of claim 1, wherein the sealing film is stacked by a Chemical Vapor Deposition (CVD) during the second film deposition process.

7. The method of claim 1, wherein the sealing film is a silicon oxide film.

* * * * *